(12) United States Patent
Sundstrom

(10) Patent No.: US 6,414,248 B1
(45) Date of Patent: Jul. 2, 2002

(54) COMPLIANT ATTACHMENT INTERFACE

(75) Inventor: Lance L. Sundstrom, Pinellas, FL (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 09/679,252

(22) Filed: Oct. 4, 2000

(51) Int. Cl.[7] ............................................. H05K 1/16
(52) U.S. Cl. .................. 174/260; 174/262; 439/65; 29/843
(58) Field of Search ................... 174/262–267, 174/260; 439/65, 66, 75; 29/842, 843

(56) References Cited

U.S. PATENT DOCUMENTS

| | | | |
|---|---|---|---|
| 3,546,775 A | * | 12/1970 | Lalmond et al. ............... 29/625 |
| 3,571,923 A | * | 3/1971 | Shaheen et al. ............... 29/625 |
| 5,381,306 A | * | 1/1995 | Schumacher et al. ....... 361/792 |
| 6,201,194 B1 | * | 3/2001 | Lauffer et al. .............. 174/264 |

* cited by examiner

Primary Examiner—Kamand Cuneo
Assistant Examiner—Jeremy Norris
(74) Attorney, Agent, or Firm—Robert E. Greenstien

(57) ABSTRACT

Parallel surfaces are interfacially mechanically bonded and optionally electrically, and/or thermally connected using an interposer fabricated from a flexible laminates, such as flex PWB. The bond/connection points for the device made on one side of the interposer are displaced in the X and Y axis from the bond/connection points on the other or obverse side for the interposer and the board. The optional electrical/thermal connection through the interposer is made through one or more traces and vias in the flex board.

18 Claims, 2 Drawing Sheets

COMPLIANT ATTACHMENT INTERFACE

BACKGROUND

This invention relates to techniques for forming a compliant interfacial mechanical, thermal and/or electrical bond interface between planar surfaces.

A single chip module (SCM) or multichip module (MCM) for military or space applications typically has a surface mount ceramic single chip package (SCP) or multichip package (MCP) for hermeticity, reliability, thermal and double-side printed wiring board assembly (PWA) requirements.

A peripheral leaded ceramic quad flat pack (CQFP) package with a high pin count requires a large ceramic body and an even larger PWB footprint. Even with a small lead pitch of 20 mils, a square CQFRP package with 144 to 576 pins requires a ceramic body size of about 0.80 to 2.96 inches on a side, a PWB footprint size of about 1.16 to 3.32 inches on a side (about 0.36 inches larger than the ceramic body on each side due to formed peripheral leads) and has a surface interconnect density (number of PWB contacts divided by the PWB footprint area) of 107 to 52 contacts per square inch. In contrast, a square ceramic area array (CAA) package with 144 (12×12) to 576 (24×24) pins, such as a land grid array (LGA), ball grid array (BGA), column grid array (CGA) or pin grid array (PGA), with a 50 mil grid pitch requires a ceramic body and PWB footprint size of 0.60 to 1.20 inches on a side with a constant interconnect density of 400 p ins per square inch.

In comparis on, these CAA packages require only 0.27 to 0.13 times the area and offer 3.74 to 7.65 times the interconnect densities of their equivalent CQFP packages. The PWB footprint area and interconnect density advantages of CAA over CQFP packages increases with pin count.

Surface mount attachment of large heavy ceramic packages to a PWB for military and space applications presents several challenges in terms of electrical and thermal erformance, mechanical integrity, reliability, assembly and rework. For one, the temperature coefficient of expansion (TCE) differences between the package body and PWB materials, along with PWB deflections, under worst case shock, vibration, acceleration and temperature cycling environments can cause distortions and high stress levels in the attachment and interconnect interfaces.

The attachment and interconnect interfaces of a surface-mounted CQFP package are typically separate. The attachment interface is comprised of interfacial solder and/or epoxy between the ceramic body and the PWB. The interconnect interface is comprised of relatively long gull-lead-formed peripheral leads which provide X-axis, Y-axis and Z-axis compliance.

The attachment and interconnect interfaces of CAA packages (LGA, BGA, CGA or PGA) are one and the same. With conventional vapor phase solder surface-mount assembly, the attachment/interconnect interface is comprised of an interfacial array of short direct vertical solder ball, solder column or pin connections. This array of rigid vertical interfacial connections has some X-axis and Y-axis compliance (amount dependent upon connection aspect ratio or length divided by cross-sectional area), but offers little or no Z-axis compliance. For an area array package to be used in military and space applications, its interfacial attachment/interconnect interface should be modified to provide enough X-axis, Y-axis and Z-axis compliance to absorb distortions of the interfacial interface between the package and the PWB and to reduce stress on solder (or other adhesive) joints that leads to attachment and/or connection failures.

SUMMARY OF THE INVENTION

An object of the present invention is to provide an improved method of interfacially mechanically bonding two surfaces with one or more compliant paths that may also be electrically and/or thermally conductive, such as mounting and interconnecting an electronic device to a PWB.

According to the invention, a compliant (flexible) interposer is used to form part of one or more interfacial electrical, mechanical and/or thermal attachment/conduction paths between two surfaces, such as a PWB and a SCM or MCM (LGA, BGA, CGA or PGA), a connector, a heat sink or another PWB. Assuming that the surfaces to be connected and the interposer lie parallel to a horizontal X-Y plane, each electrical, mechanical and/or thermal path between the two interposer surfaces is made through a path comprised of two vertical columns (attachment interfaces) of adhesive material (one between each surface and the interposer) and a horizontal and possibly a vertical path through the interposer itself. Each path through the interposer is comprised of a pair of attach pads, one on each side and displaced from each other in the X and Y directions, at least one surface or buried trace to provide a horizontal connection and one or more vias to provide a vertical connections if the attach pads are not on opposite sides of the same conductor layer.

The example depicts the case of the horizontal path comprised of two opposing surface traces with vias connecting them. Each surface trace has an integral (mask-defined) attachment pad at one end and an integral via pad at the opposite end. Each via connects the attach pad portion of one surface trace to the via pad portion of the opposing surface trace. Therefore, each mask defined attach pad has redundant trace-via and via-trace conduction paths to its mating mask-defined (X,Y displaced) attach pad on the opposite side of the interposer.

According to one aspect of the invention, conductive or non-conductive bumps (e.g. solder, epoxy or thermoplastic) are first applied to one or more pairs of the attach pads on opposite sides of the interposer and are subsequently bonded to mating attach pads on a PWB and a device to form one or more electrical, mechanical and/or thermal connection paths between the PWB and device.

According to one aspect of the invention, the surface trace width is tapered from the full diameter of the integral attach pad at one end to the full diameter of the integral via pad at the other end to minimize electrical and thermal resistance between attach pad pairs.

A feature of the present invention, it is especially useful in improving the reliability of interfacial interfaces under high G-force applications, such as space craft and high performance aircraft.

Other objects, benefits and features of the invention will apparent to one of ordinary skill in the art from the drawing and following description.

DESCRIPTION

Figure 1:
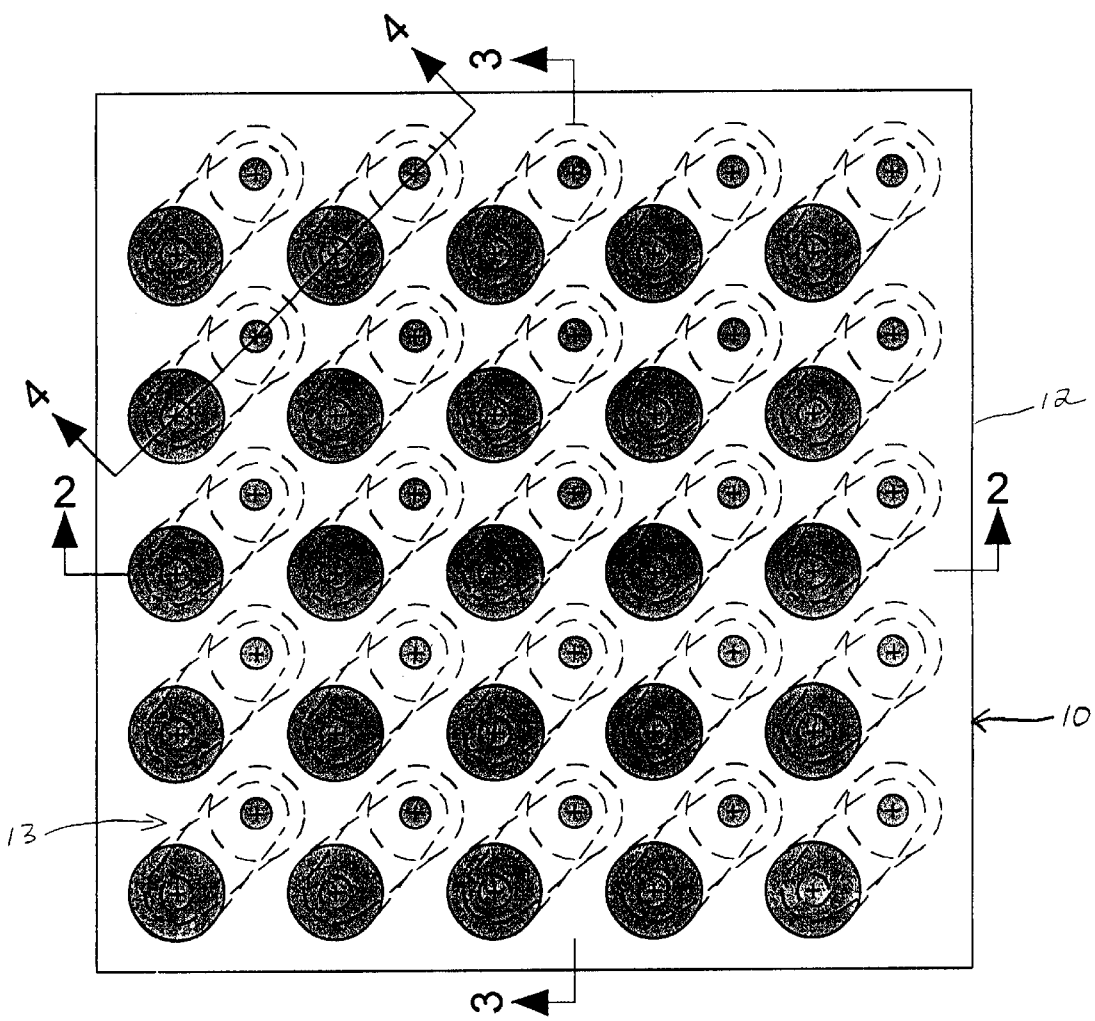
FIG. 1 is top plan view of an interposer embodying the present invention.
Figure 2:
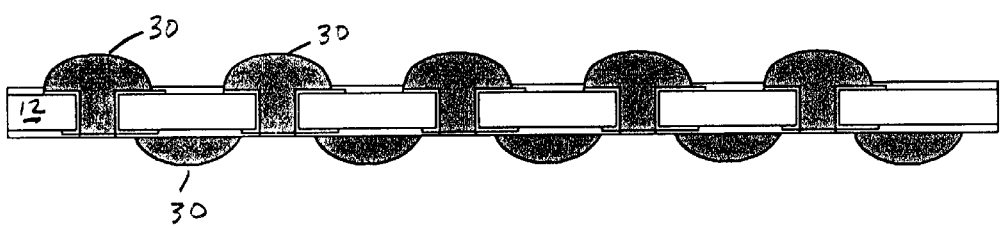
FIG. 2 is a cross-section along line 2—2 in FIG. 1.
Figure 3:
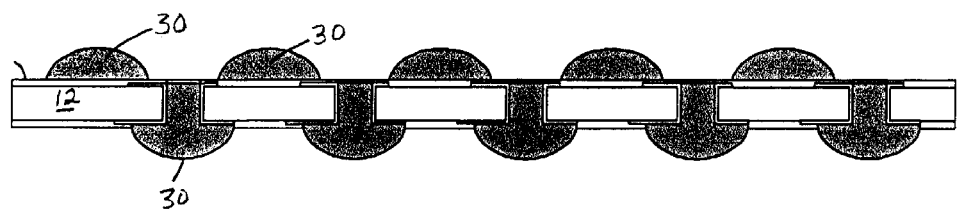
FIG. 3 is a cross-section along line 3—3 in FIG. 1.
Figure 4:
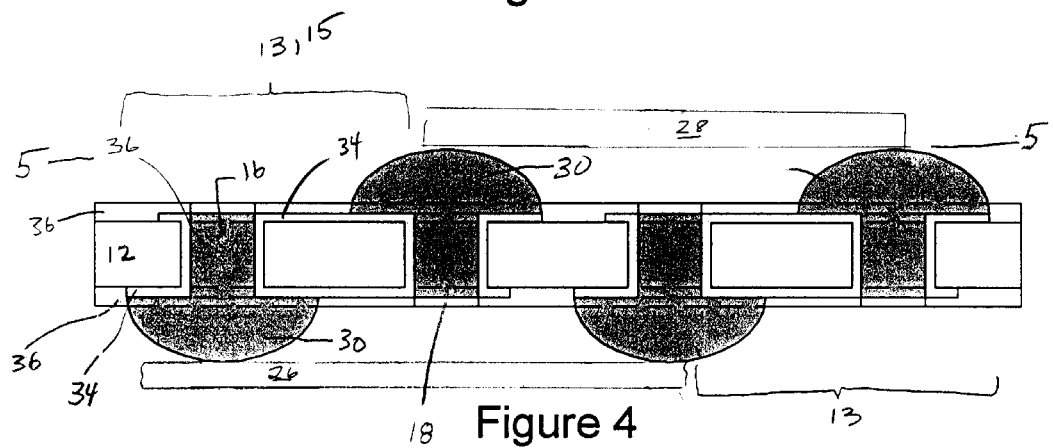
FIG. 4 is a cross-section along line 4—4 in FIG. 1

Referring to FIG. 1 and FIG. 4, an interposer 10 is fabricated using a flex PWB 12 with a plurality of integral connection paths 13, each comprised of a pair of directly opposing surface traces 14, 15 (e.g. foil conductors) and a pair of vias 16, 18 (conductive lined and/or filled passages) that extend in the Z direction, through the flex PWB 12. Focusing in particular on just one connection path 13, each surface trace 14, 15 is comprised of an integral mask-defined attach pad 20, 22 at one end and a smaller integral via pad 24, 26 at the other (opposite) end. The attach pads are displaced from each other in the X and Y directions, e.g. by half a grid. Each via 16, 18 connects the center of each attach pad 20, 22 for each trace 14, 15 to the center of the via pad 24, 26 on the opposite side of the flex circuit board 12.

Figure 5:
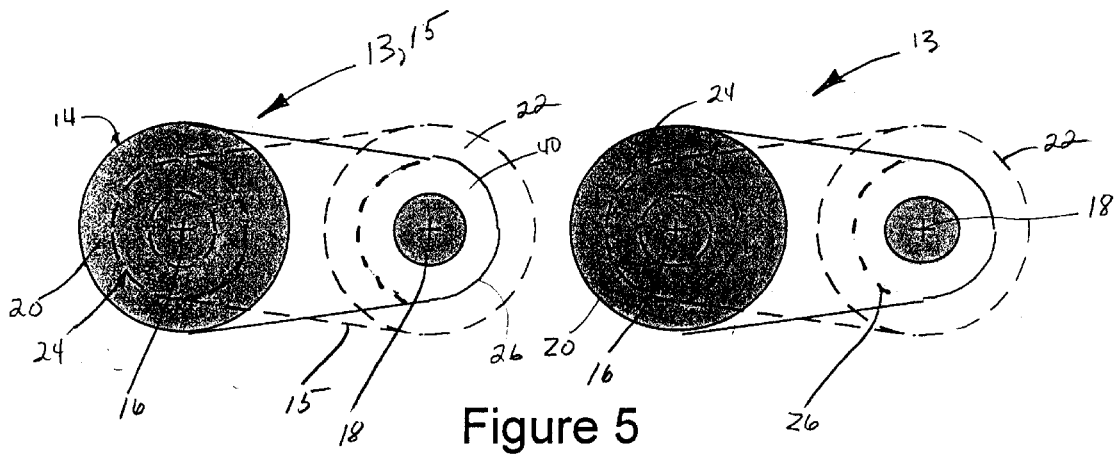
FIG. 5 is a top plan view along line 5—5 in FIG. 4

FIGS. 4 and 5 illustrate that the surface traces 14, 15 on the top and bottom of the flex PWB 12 and the vias through the flex PWB 12 create redundant connection paths within the interposer between each pair of attach pads 20, 22, which provides an electrical, mechanical and/or thermal connection path between one surface 32 (e.g. a main PWB) and another surface 28 (e.g. a device). A solder or polymer bump 30 is formed on one attach pad 20 over via 16. Likewise, a solder or polymer bump 30 is formed on the other attach 22 over via 18. Solder bumps are one way to interfacially attach one surface 28 (e.g. a device) to the interposer 10 and the interposer 10 to another surface 32 (e.g. a PWB) forming one or more electrical, mechanical and/or thermal connection paths between the surfaces 28 and 32. The solder bumps can be formed by screen printing or stenciling solder paste on the attach pads of both sides, followed by a vapor phase reflow or by a controlled solder dipping process. Polymer bumps can be formed by screen printing or stenciling polymer onto the attach pads of both sides followed by a partial cure. Surface solder or polymer mask layers 36 should cover all but the attach pad areas 20 and 22 of the surface traces 14, 15 and vias 16, 18. This limits solder or polymer whetting and bonding to attach pads 20, 22, promotes self-alignment of the device to interposer and interposer to PWB interfaces and vents the vias. Vias are vented so that whetting and capillary action fills the holes with solder or polymer as they are applied. Conventional techniques can be used to fabricate the connection paths 13 in the interposer 10 that make electrical and/or mechanical connections between one surface 32 (e.g. a PWB) and another surface 28 (e.g. a device) at various connection points, as described. For instance, assuming the flex PWB is double-clad cast polyamide, standard PWB processes are used to drill and plate holes with copper 34 to form vias and pattern surface traces 20, 22. All but the attach pad and via holes are masked 36 and solder or polymer 30 is applied to the top and bottom of the interposer 10. In its liquid form (during reflow or partial cure) the solder or polymer fills the vias 14, 16 and forms a hemispherical bump 30 due to capillary action and a combination of surface tension and adhesion to the attach pads 20, 22.

Because the attach pads to one surface 28 (e.g. a device) are displaced in the X and Y directions relative to the attach pads to the other surface 32 (e.g. a PWB), mechanical stresses due to flexing of the interface in the Z direction are better tolerated as compared to a direct vertical connections in the Z direction between the surfaces 28, 32. The conductive traces 20, 22 in the X-Y plane form a jog or cantilever in each connection path that absorbs Z-axis deflections and reduces stress on solder or polymer joints. The amount of X-axis and Y-axis compliance is defined by the combined height of the vias and the solder or polymer bumps when the device and wiring board on attached to the interposer. Another assembly processes would include pre-forming solder or polymer bumps on the attach pads of the surfaces 28, 32 to be attached instead of on the attach pads of the interposer 10. Another assembly process would include applying solder or polymer paste to the attach pads of either the interposer 10 or attach surfaces 28, 32, placing the interposer 10 between the surfaces 28, 32 and reflowing or curing the solder or polymer bonds in a single step (i.e. no pre-bumping).

It should be appreciated that an interposer 10 construction with a single conductor layer is possible, where the attach pad pairs 20, 22 are integral parts of a common trace 14/15, vias 16, 18 are not required. In an application, where only mechanical solder bonding is required (no electrical or thermal connection required), only the solderable attach pads 20, 22 and the mask layers 36 are required in the interposer 10 construction.

Likewise, in the case where only mechanical polymer bonding is required (no electrical or thermal connection required), only the mask layers 36 are required in the interposer 10 construction.

In some applications, where only mechanical bonding and a single electrical and/or thermal conduction path is required, only the mask layers 36, over a continuous flexible electrically and/or thermally conductive sheet (e.g. copper), would be required in the interposer 10 construction.

One skilled in the art may make modifications, in whole or in part, to described embodiment of the invention and its various functions and components without departing from the true scope and spirit of the invention.

What is claimed is:

1. An interposer for interfacially bonding two surfaces, comprising:
   a circuit board having a top and bottom surface;
   first and second vias extending through the circuit board and displaced from each other in X and Y directions along the top and bottom surfaces;
   first and second traces connecting said vias, the first trace located on the top surface, the second trace located on the bottom surface;
   a mask material to mask the top surface and first trace except for an attach area on the first trace over the first via; and
   a mask material to mask the bottom surface and the second trace except for an attach area on the second trace over the second via.

2. The interposer described in claim 1, further comprising:
   a first bump of an attachment material on the attach area on the first trace.

3. The interposer described in claim 2, further comprising:
   a second bump of attachment material on the attach area on the second trace.

4. The interposer described in claim 3, wherein the attachment material comprises solder.

5. The interposer described in claim 3, wherein the attachment material comprises a polymer.

6. The interposer described in claim 2, wherein the attachment material comprises solder.

7. The interposer described in claim 2, wherein the attachment material comprises a polymer.

8. The interposer described in claim 2, wherein:
   one end of said first and second traces has more surface area than the opposite end and a bump of attachment material is located on said one end.

9. The interposer described in claim 1, wherein:
   the traces are elongated and tapered with rounded edges surrounding the vias.

10. A method for attaching an electrical device having terminals to a printed wire circuit board having terminals, comprising:
- installing first and second vias on a circuit board at locations the displaced along an X and Y axis on bottom and top surfaces of the board;
- providing a first trace on said top surface between said first and second vias;
- providing a second trace on said bottom surface between said first and second vias;
- providing a mask on the top surface except for an attach pad on the first trace that overlays the first via;
- providing a mask on the bottom surface except for an attach pad on the second trace that overlays the second via; and
- applying an attachment material to the bottom and top surfaces to create bumps of attachment material on the attach pads;
- attaching a terminals on the device to a bump on the top surface; and
- attaching a terminal on the printed wire circuit board to a bump on the bottom surface.

11. The method described in claim 10, wherein:
- one end of each trace is larger than the other end, the larger end comprising the attach pad.

12. The combination, comprising:
- a device having a device terminal;
- a circuit board having a board terminal;
- a interposer board;
- a pair of foil conductors that are spaced apart in a Z direction between top and bottom surfaces of the board and extend in parallel in X and Y directions relative to the top and bottom surfaces;
- a first via in the Z axis connecting the foil conductors and a second via in the Z axis connecting the foil conductors, the vias being displaced from each other along the X and Y axis;
- a mask to expose a first attach area over the first via;
- a mask to expose a second attach area over the second via;
- first means applied over the mask material for connecting the board terminal to the first attach area; and
- second means applied over the mask material for connecting the circuit board terminal to the second attach area.

13. The combination described in claim 12, wherein: the first and second means comprise solder.

14. The combination described in claim 13, wherein the first and second means comprise a polymer.

15. An interposer comprising:
- a board;
- a pair of foil conductors that are spaced apart in a Z axis between top and bottom surfaces of the board and extend in parallel in X and Y directions relative to the top and bottom surfaces;
- a first via in the Z axis connecting the foil conductors and a second via in the Z axis connecting the foil conductors, the first and second vias being displaced from each other along the X and Y axis;
- a mask defining a first attach area on the bottom surface on one foil conductor of said pair over a the first via; and
- a mask defining a second attach area on the top surface of a second foil conductor of said pair over the second via.

16. An interposer comprising:
- a flexible membrane;
- a mask defining a first attach area on a bottom surface of the membrane; and
- a mask defining a second attach area on a top surface of the membrane;
- the first and second attach areas being displaced from each other on an X-Y axis of a plane passing through a center of the membrane and parallel to the top surface and bottom surface.

17. A method for attaching a device to a circuit board, comprising:
- masking a top surface of a flexible membrane except for first attach areas;
- masking a bottom surface of the flexible membrane except for second attach areas, the first and second attach areas being displaced in the X-Y axis of a plane that is parallel to the top and bottom surfaces;
- applying an attachment material to the bottom and top surfaces to create first and second bumps of attachment material respectively on the first and second attach areas;
- mating the device and the first bumps; and
- mating the circuit board and the second bumps.

18. The combination, comprising:
- a device;
- a circuit board;
- a flexible membrane;
- a mask defining a first attach area on a bottom surface of the membrane;
- a mask defining a second attach area on a top surface of the membrane, the first and second attach areas being displaced from each other on an X-Y axis of a plane passing through a center of the membrane and parallel to the top surface and bottom surface;
- an adhesive on the first attach area that attaches the device to the membrane; and
- an adhesive on the second attach area that attaches the membrane to the circuit board.

* * * * *